United States Patent
Lai et al.

(10) Patent No.: US 7,881,365 B2
(45) Date of Patent: Feb. 1, 2011

(54) DEMODULATOR WITH CONFIGURABLE ADAPTIVE EQUALIZER

(75) Inventors: Yhean-Sen Lai, Warren, NJ (US); Zhenyu Wang, Bethlehem, PA (US); Jinguo Yu, Flemington, NJ (US)

(73) Assignee: Agere Systems Inc., Allentown, PA (US)

( * ) Notice: Subject to any disclaimer, the term of this patent is extended or adjusted under 35 U.S.C. 154(b) by 709 days.

(21) Appl. No.: 11/932,320

(22) Filed: Oct. 31, 2007

(65) Prior Publication Data
US 2009/0110047 A1 Apr. 30, 2009

(51) Int. Cl.
*H03H 7/30* (2006.01)
(52) U.S. Cl. .................. 375/232; 375/229; 375/230; 375/233
(58) Field of Classification Search ............ 375/232, 375/229, 230, 233
See application file for complete search history.

(56) References Cited

U.S. PATENT DOCUMENTS

| | | | | |
|---|---|---|---|---|
| 5,604,769 A * | 2/1997 | Wang | .......................... | 375/229 |
| 5,642,382 A * | 6/1997 | Juan | ............................ | 375/232 |
| 6,570,917 B1 * | 5/2003 | Lai et al. | ..................... | 375/232 |
| 6,768,457 B2 * | 7/2004 | Lindenmeier | ............... | 342/374 |
| 6,891,896 B1 * | 5/2005 | Betts | .......................... | 375/264 |
| 6,993,067 B1 * | 1/2006 | Betts et al. | ................... | 375/214 |
| 7,656,966 B2 * | 2/2010 | Walker et al. | ................ | 375/308 |
| 7,746,925 B1 * | 6/2010 | Hsu et al. | ..................... | 375/233 |
| 7,778,335 B2 * | 8/2010 | Smallcomb et al. | ......... | 375/260 |
| 2004/0096012 A1 * | 5/2004 | Yang | ......................... | 375/308 |
| 2004/0146123 A1 | 7/2004 | Lai | ............................ | 375/329 |
| 2005/0084040 A1 * | 4/2005 | Stewart et al. | .............. | 375/324 |
| 2005/0254600 A1 * | 11/2005 | Chen et al. | ................... | 375/324 |
| 2006/0264191 A1 | 11/2006 | Lai | .......................... | 455/127.2 |
| 2007/0041473 A1 * | 2/2007 | Chen et al. | ................... | 375/329 |
| 2009/0168809 A1 * | 7/2009 | Scarpa et al. | ............... | 370/503 |
| 2009/0285155 A1 * | 11/2009 | Scarpa et al. | ............... | 370/326 |

\* cited by examiner

*Primary Examiner*—Juan A Torres
(74) *Attorney, Agent, or Firm*—Mendelsohn, Drucker & Associates, P.C.; Steve Mendelsohn

(57) ABSTRACT

An improved multi-channel receiver for satellite broadcast applications or the like. In an exemplary embodiment, the receiver has an adaptive equalizer configurable to operate with QPSK or 8PSK modulated signals. In the equalizer, a slicer table memory responsive to an 8-level quantizer (slicer) and a select signal is configured to map the output of the quantizer into QPSK or 8PSK symbol coordinates depending on whether the QPSK or the 8PSK signal is being received. The slicer table memory may be loaded with the symbol coordinates calculated from data in the 8PSK signal. A pattern matcher determines if the 8PSK or the QPSK signal is being received and asserts the select signal to configure the slicer table memory accordingly.

20 Claims, 3 Drawing Sheets

DEMODULATOR WITH CONFIGURABLE ADAPTIVE EQUALIZER

TECHNICAL FIELD

The present invention relates to digital data receivers, and, in particular, to digital demodulators for use in satellite broadcast systems or the like.

BACKGROUND

A typical satellite digital audio radio service (SDARS) system, such as that provided by XM Satellite Radio Inc. of Washington, D.C. or Sirius Satellite Radio Inc. of New York City, N.Y., uses two or more satellites with orbits that provide a usable signal over most of North America at all times. However, the signals from the satellites tend not to be received well in cities or anywhere a satellite receiver does not have an unobstructed view of at least one of the satellites. Thus, in cities and other areas where direct reception from a satellite is impossible or unlikely, the SDARS provider may have installed terrestrial repeaters that provide a digital audio data signal carrying the same digital audio data that the satellites are broadcasting. The use of redundant digital audio data channels minimizes service outages as the satellites orbit the earth or as a user moves about. To minimize interference and provide redundancy, the terrestrial repeaters transmits its digital audio signal on a common channel and each satellite transmits its digital audio data signal on its own channel different from the terrestrial channel, each channel having a different carrier frequency. Moreover, the modulation method used for the terrestrial channel (e.g., a coded-orthogonal frequency division multiplexed (COFDM) modulation technique) is chosen for its resistance to fading caused by multipath interference and is more complicated than the conventional modulation method used for the satellite channels (e.g., a phase shift keying time division multiplexed (PSK-TDM, herein referred to as TDM) modulation technique).

Customers of SDARS service providers are demanding additional services, such as video, over existing SDARS systems. To do so, one SDARS provider has proposed sending a data stream, carrying the additional services, as an overlay ("overlaid" data) to the existing digital audio data ("legacy" data) transmission without significantly compromising the "legacy" data transmission. As will be described in more detail below, the "overlaid" data is sent using a conventional data modulation method (used to send the "legacy" data) modified in a way that is transparent to "legacy" receivers (receivers incapable of receiving the "overlaid" data) and allowing the "legacy" receivers to continue to receive the "legacy" data, i.e., the modified modulation method is "backward compatible" with the "legacy" receivers. It is generally desirable that a receiver capable of receiving signals modulated with the modified modulation method, whether or not the "overlaid" data is used by a user of the receiver, also be capable of receiving signals modulated using the unmodified modulation method.

SUMMARY

In one embodiment, the present invention is a receiver adapted to receive at least a first signal and a second signal, the first signal corresponding to a constellation having a first set of symbols and the second signal corresponding to a constellation having a second set of symbols. The receiver comprises an equalizer with an output, and the equalizer comprises a slicer and a memory. The slicer is adapted to slice a signal from the output of the equalizer. The memory is adapted to store symbol coordinates corresponding to the symbols in the first and second sets of symbols, and is further adapted to provide a symbol coordinate for use by the equalizer. The symbol coordinate is selected from the stored symbol coordinates in response to the sliced signal and a select signal, the select signal selecting one of the first and second sets of symbols.

In still another embodiment, the present invention is a method of receiving at least a first signal and a second signal, the first signal corresponding to a constellation having a first set of symbols and the second signal corresponding to a constellation having a second set of symbols. The method comprises the step of equalizing the received signal with an equalizer to produce an equalized received signal. The step of equalizing comprises the steps of slicing the equalized received signal with a slicer, and, in response to the sliced signal and a select signal, selecting from a memory a symbol coordinate for use by the equalizer, the memory having therein symbol coordinates corresponding to the symbols in the first and second sets of symbols. The select signal selects one of the first and second sets of symbols in the memory.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Signals and corresponding nodes, ports, inputs, or outputs may be referred to by the same name and are interchangeable for purposes here. Further, the term "receiving" as used herein means more than intercepting or amplifying a signal, and includes the processing, extraction, or demodulation of a signal.

Figure 1:
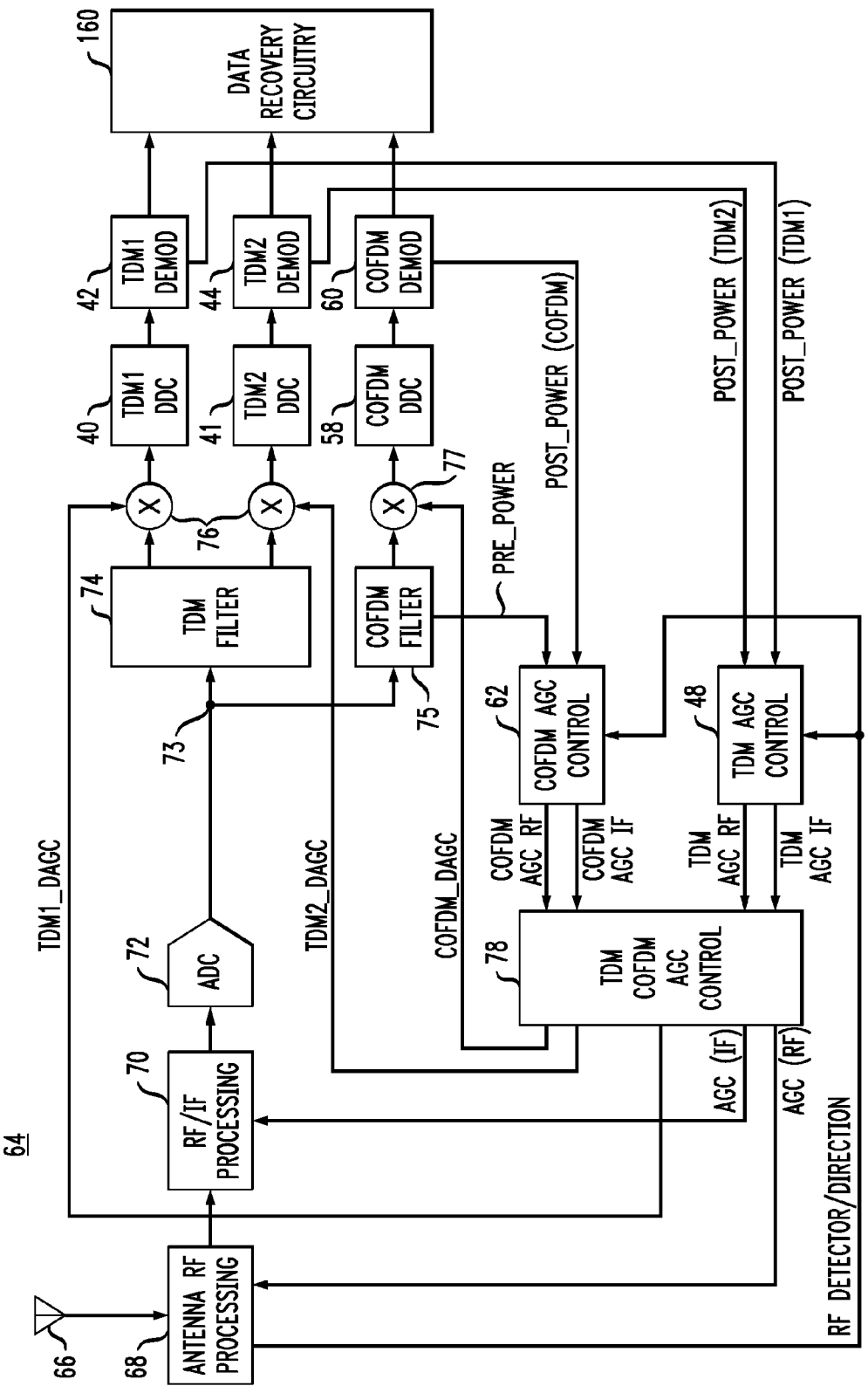
FIG. 1 is a simplified block diagram of a portion of a SDARS receiver with analog RF and IF circuitry, digital filters, frequency translators, multiple digital signal demodulators, and an AGC controller according to the one exemplary embodiment of the present invention.

Referring to FIG. 1, an exemplary embodiment of the invention is shown, in which a simplified block diagram of an SDARS receiver 64 capable of simultaneously receiving a plurality of channels (RF signals) is diagrammed. Details on a receiver similar to receiver 64 are disclosed in U.S. Patent Application Publication 2006/0264191, incorporated by reference herein in its entirety. Briefly, the receiver 64 comprises an analog RF amplifier 68, analog RF/IF amplifier 70 producing an amplified analog IF output signal, the analog IF output signal having therein a combination of one or more IF signals based on the received signals, each IF signal with a different IF carrier frequency. The analog IF output signal is digitized by an analog-to-digital converter (ADC) 72 to produce a digitized output signal at node 73. TDM and COFDM filters 74, 75 extract TDM and COFDM signals, respectively, from the digitized signal on node 73. The extracted TDM and COFDM signals are scaled by digital automatic gain control circuits 76, 77, respectively, and the scaled signals are fed to corresponding digital down-converters (DDC) 40, 41, 58. Each DDC 40, 41, 58 frequency translates the corresponding TDM and COFDM signals to baseband using a combination of conventional digital signal processing techniques, including a Hilbert transformation, band shifting, fixed decimation, and variable resampling, all controlled by a separate controller (not shown). Here, the two possible received TDM signals (TDM1 and TDM2) are frequency shifted to baseband by the corresponding DDC 40, 41 and the baseband signals sent to corresponding TDM demodulators 42, 44. Similarly, DDC 58 frequency shifts the COFDM signal and feeds the signal to the COFDM demodulator 60. Alternatively, the digital automatic gain control circuits 76, 77 may be integrated into the respective DDC 40, 41, 58. Additionally, the TDM1 and TDM2 gain control signals (TDM1_DAGC, TDM2_DAGC) may be the same signal.

In this example, there are three demodulators 42, 44, and 60, one for each channel, each demodulating a corresponding baseband digital signal derived from a received signal (for simplicity, hereinafter each demodulator is referred to as demodulating a received signal). For example, the demodulator 42 produces a demodulated signal from a received TDM signal (TDM1) from antenna 66. Each demodulator 42, 44, and 60 also provides 1) demodulator status data comprising a status flag (not shown) indicating whether or not the demodulator is demodulating ("tracking") the received signal and 2) a signal (POST_POWER) indicating the intensity or strength of the received signal being demodulated. Demodulated output signals and the tracking flags from the demodulators 42, 44, and 60 are then processed by data recovery circuitry 160 to extract audio and other information desired by a user.

The POST_POWER signal from each demodulator 42, 44, and 60 (and PRE_POWER signal from COFDM filter 75 indicating the intensity or strength of the COFDM signal being processed by the filter 75) are coupled to AGC processing circuitry 48, 62 and 78 which generates AGC control signals (COFDM_DAGC, TDM1_DAGC, TDM2_DAGC, AGC(IF), AGC(RF)).

Figure 2:
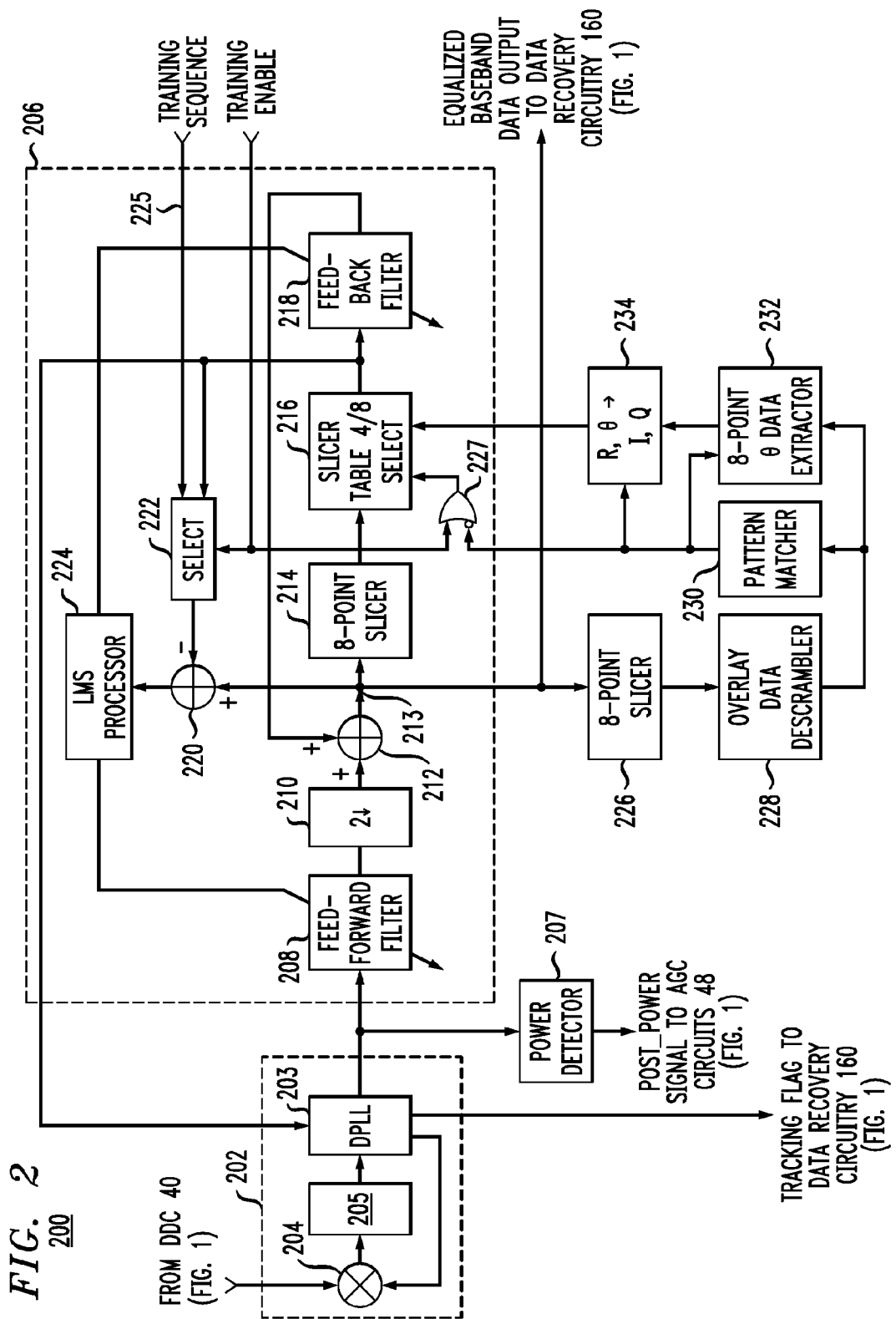
FIG. 2 is a simplified block diagram of an exemplary improved demodulator for use in the receiver of FIG. 1; and, FIG. 3 is a signal constellation diagram illustrating "legacy" and "overlaid" data symbol constellations.

FIG. 2 shows an exemplary demodulator 200 for TDM signals, e.g., demodulators 42 and 44 in FIG. 1.

For this example, the baseband TDM1 signal from the DDC 40 (FIG. 1) is fed to a conventional frequency offset correction circuit 202 that corrects for frequency variations in the received TDM1 signal caused by, for example, Doppler shifting. A typical frequency offset correction circuit 202 is implemented with a digital phase-locked-loop (DPLL) 203, along with a mixer 204 and a matched filter 205, to lock onto the baseband TDM1 signal using a signal from equalizer 206 (discussed below) as a reference. Along with cancelling the frequency variations in the baseband TDM1 signal, the circuit 202 produces the tracking flag (not numbered), discussed above, when the DPLL 203 is locked. A power detector 207 receives the output signal from circuit 202 to generate the POST_POWER signal (not numbered), discussed above.

The corrected baseband TDM signal from circuit 202 is passed through an adaptive equalizer 206, in this example, a decision-feedback equalizer, to adaptively cancel intersymbol interference. Except for the slicer 214 and slicer table memory 216, the equalizer 206 is conventional. Briefly, the TDM signal from circuit 202 passes through a feed-forward filter 208 with adjustable tap weights. The filtered signal from filter 208 is decimated by two in decimator 210 and the decimated signal fed to summer 212. The output signal from the summer 212, on node 213, is "sliced" by 8-point slicer 214 (also referred to herein as an 8-level quantizer) to produce a three-bit decision or quantization value for each symbol quantized by the slicer 214. Each three-bit quantization value corresponds to a unique I and Q value pair, each pair corresponding to a symbol (the I and Q value pair for a symbol is referred to herein as a symbol coordinate). The three-bit quantization value is used to select "ideal" symbol coordinates (i.e., the I and Q coordinate of the symbols as transmitted) from the slicer table memory 216. The "ideal" symbol coordinates are fed through feedback filter 218 to a second input of the summer 212. Like filter 208, the filter 218 has adjustable tap weights. The symbol coordinate values stored in the table memory 216 are in this example Cartesian coordinates (I and Q) of an "ideal" data symbol but it is understood that other coordinate systems, such as polar coordinates, may be used instead.

A subtractor 220, in response to the output of the slicer table memory 216 via selector 222 (the purpose of which is discussed below) and the signal on node 213, calculates an error signal representing the geometric distance between the "ideal" symbol coordinates from table memory 216 and the coordinates of the signal on node 213. The error signal is processed by processor 224, implementing a least-mean-squares (LMS) algorithm, that adjusts the tap weights for both filters 208, 218. As is known in the art and as used in this example, the LMS algorithm is used to adaptively calculate the tap weights for the filters 208 and 218 until the error signal from subtractor 220 is reduced below a threshold amount, after which the equalizer is considered to be "converged." The processor 224 continues to monitor the error signal and adjust the tap weights as needed. It is understood that other algorithms, such as a stochastic gradient method, may be implemented by the processor 224 to adjust the tap weights.

To quickly force the equalizer 206 to converge after, for example, a service interruption, the tap weights of filters 208, 218 are set to approximately the correct values by "training" the equalizer 206 with a known training symbol sequence transmitted periodically by the SDARS system. A training symbol sequence on input 225, identical to the known training symbol sequence and generated by a processor (not shown) in the receiver 64, is used to "train" the equalizer 206 during the time interval when the received TDM signal contains the known training symbol sequence. A controller (not shown) configures the selector 222 to direct the locally generated training sequence from input 225 into the subtractor 220 during the training period, during which time the processor 224 adjusts the tap weights in filters 208, 218 to approximately the final values. After the training period ends, the selector 222 is configured back to source the output of table memory 216 to subtractor 220 and the processor 224 continues to adaptively calculate the tap weights, if needed, as described above. After the equalizer 206 has converged, i.e., the equalizer is properly equalizing the received TDM signal, the signal on node 213 is the equalized TDM signal and the signal is further processed by data recovery circuitry 160 (FIG. 1).

As will be discussed in more detail in connection with FIG. 3, the SDARS system in this example transmits the above-described "overlaid" data imbedded in an eight-phase shift keying (referred to herein as 8PSK) modulated TDM signal. Either the above-described "legacy" data is the quadrature portion of the 8PSK signal (separate from the "overlaid" data, as described below) or it is transmitted as quadrature phase shift keying (referred to herein as QPSK) modulated TDM signal without the "overlaid" data. In either case, the training sequences are transmitted in QPSK. (For simplicity, TDM signals on, for example, node 73 or node 213 may be referred to herein as 8PSK or QPSK signals depending on the modulation used.) Thus, it is desirable for the equalizer 206 to operate with either 8PSK or QPSK modulation. To do so, slicer 214 is an 8-point (8-level) quantizer and slicer table memory 216 is configurable for mapping the 3-bit output of the slicer 214 for 8PSK or QPSK symbols. In this example, the symbol coordinates for the QPSK symbols are known a priori and stored in a table (here a QPSK symbol table) in the table memory 216 so that, when QPSK is being received, the slicer table memory 216 may be configured (in response to a select signal, discussed below, applied to input 4/8 SELECT) to map the output of quantizer 214 into one of four symbols. When 8PSK is being received, the slicer table memory 216 may be configured (in response to the select signal applied to input 4/8 SELECT) to map the output of the quantizer 214 into one of eight symbols stored in another table (here an 8PSK symbol table) within the slicer table memory 216. In this example and as will be discussed below, the 8PSK symbol coordinates are not known a priori and the data needed to calculate the symbol coordinates are transmitted in certain fields of the "overlaid" data. The calculated symbol coordinates are then loaded into the slicer table memory 216. However, because the 8PSK symbol coordinates might not be known before the "overlaid" data is received, the 8PSK symbol table in the table memory 216 may be preset with approximate 8PSK symbol coordinates. Also, in this example, the select signal to input 4/8 SELECT on memory 216 may be asserted by a controller (not shown) or from a circuit that detects when 8PSK is being received, as discussed below.

As mentioned above, the training sequence is in QPSK. If training of the equalizer 206 is needed, then the slicer table memory 216 is forced via exemplary OR gate 227 to map the output of the slicer 214 into QPSK symbol coordinates stored in the QPSK symbol table in the table memory 216 regardless of whether QPSK or 8PSK is being sent outside of the training period. (The OR gate 227 is used in this example to control the 4/8 SELECT input of table 216 since the assertion of the TRAINING ENABLE signal to one input of the OR gate 227 will override a flag from matcher 230, discussed below, applied to another input of the gate 227; other embodiments can be used instead of an OR gate.)

In this example and as will be explained further in connection with FIG. 3, it is assumed that, if valid "overlaid" data is being received, then the received TDM signal is using 8PSK modulation. To extract the "overlaid" data, the output of equalizer 206 is quantized by an 8-point slicer 226 and the least significant bit from the slicer is sent to an optional descrambler 228. The descrambling algorithm (if implemented) is set by the SDARS service provider. The descrambled output from descrambler 228 is the "overlaid" data if an 8PSK signal is being received. In this example, the descrambled output is random data if no TDM signal is being received or a QPSK signal is being received. A conventional pattern matcher 230, discussed below, detects if a known, predefined bit sequence (as specified by the SDARS service provider and which can be hundreds of bits long) occurs in the descrambled data from descrambler 228. If the pattern is detected, then a flag from matcher 230 (the select signal, discussed above) is asserted that indicates an 8PSK signal is being received and the slicer table memory 216 is configured (via inverting input of OR gate 227 and applied to the 4/8 SELECT input) to produce 8PSK symbol coordinates; otherwise QPSK symbol coordinates are produced. The 8PSK symbol coordinates may be calculated from offset angle ($\theta$) information transmitted by SDARS service provider in a specified bit field in the "overlaid" data. In response to the flag from matcher 230, extractor 232 extracts the offset angle information in the specified bit field for use by converter 234. As will be shown in FIG. 3, $\theta$ in this example is the angular offset of 8PSK symbols with respect to corresponding QPSK symbols. Since the 8PSK symbols are assumed to lie on the same circle with the same, known, fixed radius as the QPSK symbols, the angle $\theta$ is needed to calculate the symbol coordinates of the 8PSK symbols. Using a conventional polar-to-Cartesian coordinate conversion algorithm, converter 234, in response to the flag from matcher 230, calculates the I and Q coordinates for each of the eight 8PSK symbols using the offset angle $\theta$. The calculated I and Q data for all eight 8PSK symbols are then loaded into the 8PSK symbol coordinate table in the slicer table memory 216. To save time and power, the converter 234 may use pre-calculated data stored in look-up tables to determine the coordinates for various values of $\theta$. In addition, the slicers 214 and 226, shown separately in this example, can be combined.

The pattern matcher 230 discussed above scans the descrambled data from descrambler 228 for the predefined bit sequence and asserts the flag when there is at least a partial match between the predefined bit sequence and the descrambled data. Even though, in this example, the predefined bit sequence is transmitted periodically in the 8PSK signal, because of signal dropouts, noise, etc., the matcher 230 holds the asserted flag for an amount of time to allow for a specified number of missed predefined bit sequences to pass before negating the flag. In one implementation of the pattern matcher 230, the flag is asserted when at least a specified number of the predefined bit pattern bits (or the complement of the bit pattern) are matched in the descrambled data. Because of the possibility of slicing errors by slicer 226 when slicing "noisy" and improperly equalized symbols, the number of bits needed for a match should be less than all of the bits of the predefined bit pattern. Other implementations may be used as well.

The equalizer 206 is preferably adapted to equalize according to the type of modulation of the signal being received. For example, even though the equalizer 206 can operate satisfactorily with only QPSK symbol coordinates from the table memory 216 (in which case the slicer 214 can be a simpler 4-point slicer) when equalizing an 8PSK signal, the performance of the receiver 64 (as measured by the receiver's error rate for a given signal-to-noise ratio) may be improved when the equalizer 206 uses 8PSK symbol coordinates from the slicer table memory 216 when equalizing an 8PSK signal. Similarly, while the equalizer 206 can operate satisfactorily with only 8PSK symbol coordinates from the table memory 216 when equalizing a QPSK signal, the performance of the receiver 64 (again as measured by the receiver's error rate for a given signal-to-noise ratio) may be improved when the equalizer 206 uses QPSK symbol coordinates from the slicer table memory 216 when equalizing a QPSK signal. Moreover, the selectable symbol coordinate tables in the symbol table memory 216 allow for a single equalizer to be used for both QPSK and 8PSK (or other) modulation types and to be automatically configurable to equalize either modulation type. Advantageously, the "overlaid" data from descrambler 228 and the flag from matcher 230 may be used by the data recovery circuitry 160 (FIG. 1) without the need for additional circuitry to extract the "overlaid" data from the equalized TDM signals on node 213.

Figure 3:
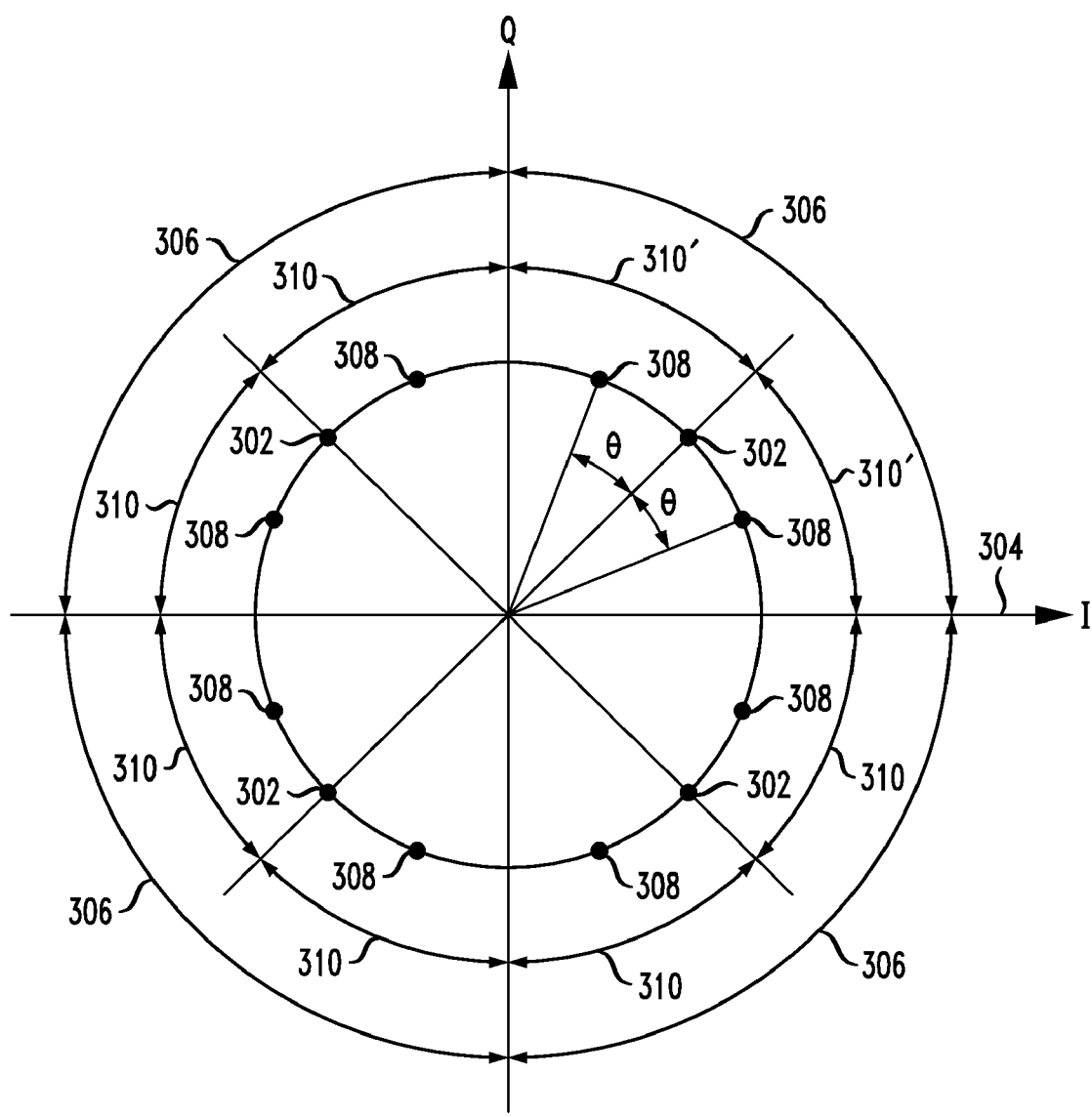

FIG. 3 illustrates exemplary symbol constellations for both QPSK and 8PSK signals. When QPSK data is being sent, the four QPSK symbols 302 appear in separate quadrants 306, the symbols 302 having angles of 45, 135, 225, and 315 degrees with respect to axis 304. When 8PSK data is being sent, the 8PSK symbols 308 appear in separate octants 310. Pairs of 8PSK symbols 308 are angularly displaced from corresponding QPSK symbols on either side by the amount θ, the angle θ being transmitted by the SDARS service provider in the "overlaid" data in the 8PSK signal.

Quantizing the QPSK symbols 302 with a 4-point slicer results in two data bits whose values depend on in which quadrant the received symbol occurs. Similarly, quantizing the 8PSK symbols 308 with an 8-point slicer results in three data bits whose values depend on in which octant the received symbol occurs.

Quantizing the 8PSK symbols 308 with a 4-point slicer results in the loss of one of three possible bits of information in the 8PSK signal since each quadrant 306 has a pair of the symbols 308. The 8PSK transmissions are designed in this example so that the lost bit (here the LSB of the three possible bits) carries the "overlaid" data and the output of the 4-point slicer is the "legacy" data. This allows for backward compatibility for receivers incapable of receiving the "overlaid" data.

However, quantizing the QPSK symbols 302 with an 8-point slicer results in the two most significant bits from the quantizer being the same as would come from a 4-point slicer. In this example, the LSB from the 8-point slicer would typically be random data or noise since the QPSK symbols 302 are on a boundary between pairs of adjacent octants 310 (e.g., adjacent octants 310') and could be quantized as being in either adjacent octant 310'. Thus, in this example, random data or the "overlaid" data occurs in the LSB output of the 8-point quantizer when a QPSK signal or an 8PSK signal is received, respectively. Since it is very unlikely that the pattern matcher 230 will detect a predefined bit pattern many hundreds of bits long in random data (particularly after being processed by descrambler 228 which has the effect of randomizing data that was not scrambled using a scrambling pattern corresponding to the descrambling pattern of the descrambler 228), the output of pattern matcher 230 is a good indication of when "overlaid" data (thus an 8PSK signal) is being received.

It is understood that the equalizer 206 may be adapted to equalize two or more types of modulation in addition to, or instead of, the exemplary 8PSK and QPSK described above. For example, other modulation techniques that equalizer 206 can be adapted to equalize include quadrature amplitude modulation (QAM), minimum shift keying (MSK), binary phase shift keying (BPSK), etc., with a slicer and slicer table data suitable for the modulation type. Desirably, the number of quantizer levels of slicer 214 should be at least as large as the largest number of symbols of the modulation type expected to be received.

Advantageously, all of the digital circuitry of the receiver 64 (FIG. 1) may be implemented in one or more programmable digital processors or fixed logic devices, such as microprocessors, digital signal processors (DSP), programmable logic devices (PLD), gate arrays, etc.

Although the present invention has been described in the context of an SDARS receiver, those skilled in the art will understand that the present invention can be implemented in the context of other types of multi-channel receivers, such as and without limitation, diversity receivers.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A receiver adapted to receive at least a first signal and a second signal, the first signal corresponding to a constellation having a first set of symbols and the second signal corresponding to a constellation having a second set of symbols, and having an equalizer with an output, the equalizer comprising:
   a slicer adapted to slice a signal from the output of the equalizer; and
   a memory adapted to store symbol coordinates corresponding to the symbols in the first and second sets of symbols, the memory further adapted to provide a symbol coordinate for use by the equalizer, the symbol coordinate selected from the stored symbol coordinates in response to the sliced signal and a select signal, the select signal for selecting one of the first and second sets of symbols.

2. The receiver of claim 1, the receiver further comprising:
   a detector, coupled to the output of the equalizer, adapted to 1) detect whether the receiver is receiving the second signal and 2) assert the select signal in response thereto.

3. The receiver of claim 2, wherein the detector comprises:
   a slicer coupled to the output of the equalizer and adapted to generate a bit stream output; and
   a pattern matcher adapted to assert the select signal when the bit stream at least partially matches a known bit pattern;
   wherein the second signal contains a bit pattern the same as the known bit pattern.

4. The receiver of claim 3, wherein the detector further comprises a descrambler, coupled to the slicer, adapted to descramble the bit pattern.

5. The receiver of claim 3, wherein the pattern matcher is adapted to assert the select signal after determining that at least a specified number of the known bit pattern bits are matched in the bit stream, the specified number of bits being less than all of the bits of the known bit pattern.

6. The receiver of claim 1, wherein the memory has therein a first table of symbol coordinates corresponding to the symbols in the first set of symbols and a second table of symbol coordinates corresponding to the symbols in the second sets of symbols; and wherein the symbol coordinates are selected from the first or the second table of symbol coordinates, the first or second table is selected in response to the select signal, and the symbol coordinate is selected from the selected table in response to the sliced signal.

7. The receiver of claim 1, wherein the second signal contains data related to the symbol coordinates of the symbols of the second set of symbols, the receiver further comprising:
   a circuit, coupled to the output of the equalizer, adapted to extract the data from the second signal; and
   a circuit, responsive to the extracted data, adapted to calculate the symbol coordinates for the symbols in the second set of symbols and load the calculated symbol coordinates into the memory.

8. The receiver of claim 7, wherein the symbol coordinates corresponding to the symbols in the first set of symbols are known a priori and stored in the memory, and wherein approximate symbol coordinates corresponding to the symbols in the second set of symbols are stored in the memory before the calculated symbol coordinates are loaded therein.

9. The receiver of claim 1, wherein the second set of symbols has more symbols than the first set of symbols, and the slicer has at least as many quantization levels as there are symbols in the second set of symbols.

10. The receiver of claim 1, wherein the equalizer is a decision-feedback equalizer.

11. A method of receiving at least a first signal and a second signal, the first signal corresponding to a constellation having a first set of symbols and the second signal corresponding to a constellation having a second set of symbols, comprising the step of equalizing the received signal with an equalizer to produce an equalized received signal;
   wherein the step of equalizing comprises the steps of:
   slicing the equalized received signal with a slicer; and,
   in response to the sliced signal and a select signal, selecting from a memory a symbol coordinate for use by the equalizer, the memory having therein symbol coordinates corresponding to the symbols in the first and second sets of symbols, the select signal for selecting one of the first and second sets of symbols in the memory.

12. The method of claim 11, further comprising the steps of:
   detecting whether the second signal is being received; and
   asserting the select signal in response to the step of detecting whether the second signal is being received.

13. The method of claim 11, further comprising the steps of:
   slicing the equalized received signal to generate a bit stream;
   comparing the bit stream with a known bit pattern; and
   asserting the select signal when there is at least a partial match between the bit stream and the known bit pattern;
   wherein the second signal contains a bit pattern the same as the known bit pattern.

14. The method of claim 13, further comprising the step, after the step of slicing the equalized receive signal, of descrambling the bit stream.

15. The method of claim 11, wherein the memory has therein a first table of symbol coordinates corresponding to the symbols in the first set of symbols and a second table of symbol coordinates corresponding to the symbols in the second sets of symbols; wherein the step of selecting from the memory the symbol coordinate comprises the steps of:
   selecting the first or second table in response to the select signal; and
   selecting the symbol coordinate from the selected table in response to the sliced signal.

16. The method of claim 11, wherein the second signal contains data related to the symbol coordinates of the symbols in the second set of symbols, further comprising the steps of:
   extracting the data from the second signal;
   calculating, from the extracted data, the symbol coordinates for the symbols in the second set of symbols; and
   loading the calculated symbol coordinates into the memory.

17. The method of claim 16, wherein the symbol coordinates of the symbols in the first set of symbols are known a priori and stored in the memory, and wherein approximate symbol coordinates of the symbols in the second set of symbols are stored in the memory before the calculated symbol coordinates are loaded therein.

18. The method of claim 11, wherein the second set of symbols has more symbols than the first set of symbols, and the slicer has at least as many quantization levels as there are symbols in the second set of symbols.

19. A receiver adapted to receive at least a first signal and a second signal, the first signal corresponding to a constellation having a first set of symbols and the second signal corresponding to a constellation having a second set of symbols, the second set of symbols having more symbols than the first set of symbols, the receiver comprising:
   an equalizer having an output; and
   a detector, coupled to the output of the equalizer, adapted to 1) detect whether the receiver is receiving the second signal and 2) assert the select signal in response thereto;
   wherein the equalizer comprises:
   a slicer, having at least as many quantization levels as there are symbols in the second set of symbols, adapted to slice a signal from the output of the equalizer; and
   a memory adapted to store therein a first table of symbol coordinates corresponding to the symbols in the first set of symbols and a second table of symbol coordinates corresponding to the symbols in the second set of symbols, and further adapted to provide a symbol coordinate selected from the first table or the second table for use by the equalizer, the first or second table being selected in response to the select signal, and the symbol coordinate being selected from the selected table in response to the sliced signal.

20. The receiver of claim 19, wherein the detector comprises:
   a slicer coupled to the output of the equalizer and adapted to generate a bit stream output; and
   a pattern matcher adapted to assert the select signal when the bit stream at least partially matches a known bit pattern;
   wherein the second signal contains a bit pattern the same as the known bit pattern.

* * * * *